United States Patent [19]
Kawashima

[11] Patent Number: 5,440,257
[45] Date of Patent: Aug. 8, 1995

[54] EDGE-DETECTING PULSE GENERATOR

[75] Inventor: Shoichiro Kawashima, Kawasaki, Japan

[73] Assignee: Fujitsu Limited, Kawasaki, Japan

[21] Appl. No.: 144,502

[22] Filed: Nov. 2, 1993

Related U.S. Application Data

[63] Continuation of Ser. No. 822,281, Jan. 21, 1992, abandoned.

[30] Foreign Application Priority Data

Jan. 21, 1991 [JP] Japan .................................. 3-05358

[51] Int. Cl.$^6$ .......................... H03K 3/00; H03K 17/16
[52] U.S. Cl. ...................................... 327/100; 327/108; 327/387; 327/391
[58] Field of Search ............... 307/260, 241, 242, 571, 307/573, 576, 579, 585, 451; 323/315; 330/288; 327/100, 108, 387, 391

[56] References Cited

U.S. PATENT DOCUMENTS

| | | | |
|---|---|---|---|
| 4,518,926 | 5/1985 | Swanson | 330/288 |
| 4,745,395 | 3/1988 | Robinson | 323/315 |
| 4,801,826 | 1/1989 | Cornelissen | 323/315 |
| 4,950,926 | 8/1990 | Isobe et al. | 307/571 |
| 4,982,108 | 1/1991 | Connell et al. | 307/585 |
| 5,117,131 | 5/1992 | Ochi et al. | 307/451 |
| 5,124,596 | 6/1992 | Wurcer | 307/571 |

FOREIGN PATENT DOCUMENTS 63-076187  6/1988  Japan .

OTHER PUBLICATIONS

T. Yamauchi et al., "Address Transition Detection Circuit For BiCMOS High-Speed SRAM", ED-90-72, ICD90-97.

Proceedings Of The IEEE 1986 Custom Integrated Circuits Conference, May 12-15, 1986, Rochester, N.Y., pp. 439-442, G. Orton, et al., A Fast Asynchronous RSA Encryption Chip.

IBM Technical Disclosure Bulletin, Impulse Current Source, Jul. 31, 1988, Armonk, N.Y., USA, vol. 31, No. 2, pp. 173-175.

Primary Examiner—Timothy P. Callahan
Assistant Examiner—Trong Phan
Attorney, Agent, or Firm—Staas & Halsey

[57] ABSTRACT

A pulse generator includes a first current control circuit, and a first transistor having a source coupled to a first power supply line via the first current control circuit, a drain and a gate. A second transistor has a gate connected to the gate of the first transistor, a drain connected to the drain of the first transistor, and a source connected to a second power supply line. The second transistor has a conduction type different from that of the first transistor. An input terminal is connected to the gates of the first and second transistors. An input signal is applied to the input terminal. An output terminal is connected to the first current control circuit. An output pulse indicative of a change in the input signal is output via the output terminal.

13 Claims, 14 Drawing Sheets

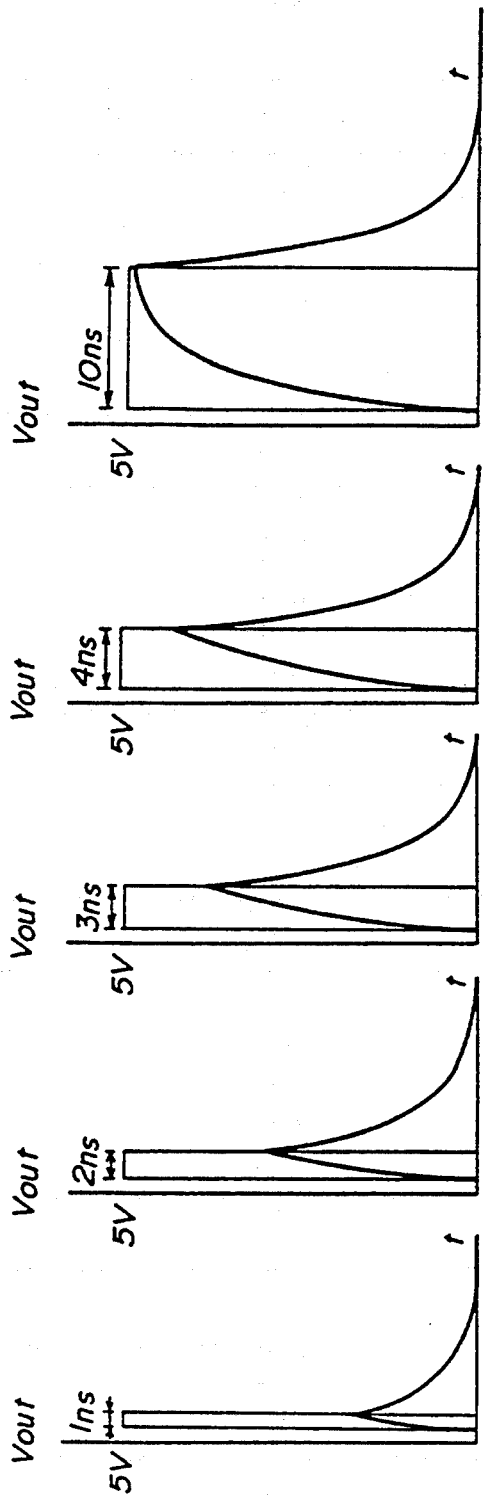

EDGE-DETECTING PULSE GENERATOR

This application is a continuation of application number 07/822,281, filed Jan. 21, 1992, now abandoned.

BACKGROUND OF THE INVENTION (1) Field of the Invention

The present invention generally relates to pulse generators, and more particularly to a pulse generator which receives an input pulse and generates a short-time pulse signal indicative of a transient change in the input pulse. Further, the present invention is concerned with a semiconductor device having such a pulse generator.

(2) Description of the Prior Art

Recently, an SRAM (Static Random Access Memory) has been equipped with an address transition detection circuit (hereinafter simply referred to as an ATD circuit). The ATD circuit detects a transition of an address signal and generates a pulse signal, which is used for resetting internal circuits of the SRAM. With this arrangement, the access speed can be increased. The conventional ATD circuit detects a rise or fall edge of the input signal, and generates a reset signal (a short-time pulse having a short pulse duration time) each time the rise or fall edge of the input signal is detected. A pulse generator as described above is also used in, for example, a row address strobe (RAS) circuit of a DRAM (Dynamic Random Access Memory). Generally, it is required that the pulse generator as described above operates at a high speed.

More specifically, a conventional ATD circuit is composed of pulse generators and a pulse combiner (see T. Yamauchi et al., "ADDRESS TRANSITION DETECTION CIRCUIT FOR BiCMOS HIGH-SPEED SRAM", ED-90-72, ICD90-97). The pulse generators, which are provided for respective address lines, respectively detect rise or fall edges of address signals carried on the address lines, and generate short-time pulses. The pulse combiner combines the signals output by the pulse generators with each other (OR logic), and generates a one-shot short-time pulse which functions as a reset signal. The same structure as described above is employed in the DRAM or other devices.

Generally, the pulse generators are arranged in the vicinity of input/output pads formed on a chip, and the pulse combiner is located at the center of the chip. The pulse generators and the pulse combiner are connected to each other by signal lines, via which the short-time pulses generated by the pulse generators are transferred. Generally, a signal line has a CR distributed constant which is not negligible with respect to the short-time pulse. The CR distributed constant distorts the waveform of the short-time pulse. Hence, there are limitations regarding the transmittable pulse width and the transmittable interval between consecutive pulses. These problems prevent the speeding up of the operation of the SRAM.

SUMMARY OF THE INVENTION

It is a general object of the present invention to provide a pulse generator in which the above problems are eliminated.

A more specific object of the present invention is to provide a pulse generator capable of generating a large-amplitude short-time pulse having little distortion.

The above objects of the present invention are achieved by a pulse generator comprising: a first current control circuit; a first transistor having a source coupled to a first power supply line via the first current control circuit, a drain and a gate; a second transistor having a gate connected to the gate of the first transistor, a drain connected to the drain of the first transistor, and a source connected to a second power supply line, the second transistor having a conduction type different from that of the first transistor; an input terminal connected to the gates of the first and second transistors, an input signal being applied to the input terminal; and an output terminal connected to the first current control circuit, an output pulse indicative of a change in the input signal being output via the output terminal.

The above-mentioned objects of the present invention are also achieved by a pulse generator comprising: a first current control circuit; a first transistor having a source coupled to a first power supply line via the first current control circuit, a drain connected to a second power supply line, and a gate; a second transistor having a gate connected to the gate of the first transistor, a drain connected to the source of the first transistor, and a source connected to the second power supply line, the second transistor having a conduction type different from that of the first transistor; an input terminal connected to the gates of the first and second transistors, an input signal being applied to the input terminal; and an output terminal connected to the first current control circuit, an output pulse indicative of a change in the input signal being generated via the output terminal.

The above-mentioned objects of the present invention are also achieved by a pulse generator comprising: a first current control circuit connected to a first power supply line; n pairs of first and second transistors having different conduction types where n is an integer, each of the n pairs being connected between the first current control circuit and a second power supply line, gates of the first and second transistors of each of the n pairs being connected to each other; n input terminals respectively connected to the gates of the n pairs of first and second transistors, n input signals being respectively applied to the n input terminals; and an output terminal connected to the first current control circuit, an output pulse indicative of a change in one of the n input signals being output via the output terminal.

The above-mentioned objects of the present invention are also achieved by a pulse generator comprising: a first current control circuit connected to a first power supply line; n pairs of first and second transistors having different conduction types where n is an integer, the n pairs being connected in series between the first current control circuit and a second power supply line, gates of the first and second transistors of each of the n pairs being connected to each other; n input terminals respectively connected to the gates of the n pairs of first and second transistors, n input signals being respectively applied to the n input terminals; and an output terminal connected to the first current control circuit, an output pulse indicative of a change in one of the n input signals being output via the output terminal.

A further object of the present invention is to provide a semiconductor device having the above-mentioned pulse generator.

This object of the present invention is achieved by a semiconductor device comprising: a memory cell array having memory cells, bit lines and word lines; address decoder means, coupled to the memory cell array, for driving the bit lines and word lines in accordance with an address signal; sense means, coupled to the bit lines, for sensing signals on the bit lines; output buffer means, coupled to the sense means, for outputting the signals sensed by the sense means to output terminals; and pulse generating means for receiving at least the address signal and for generating a pulse signal indicative of a change in the address signal, the pulse signal controlling at least one of the sense means and the output buffer means, the pulse generating means comprises: a first current control circuit connected to a first power supply line; n pairs of first and second transistors having different conduction types where n is an integer, the n pairs being connected between the first current control circuit and a second power supply line, gates of the first and second transistors of each of the n pairs being connected to each other; n input terminals respectively connected to the gates of the n pairs of first and second transistors, n input signals being respectively applied to the n input terminals; and an output terminal connected to the first current control circuit, the pulse signal being output via the output terminal.

BRIEF DESCRIPTION OF THE DRAWINGS

Other objects, features and advantages of the present invention will become more apparent from the following detailed description when read in conjunction with the accompanying drawings, in which:

FIGS. 13 and 14(a)-(e) are graphs showing how short-time pulses are transferred on a signal line.

DESCRIPTION OF THE PREFERRED EMBODIMENTS

Figure 1:
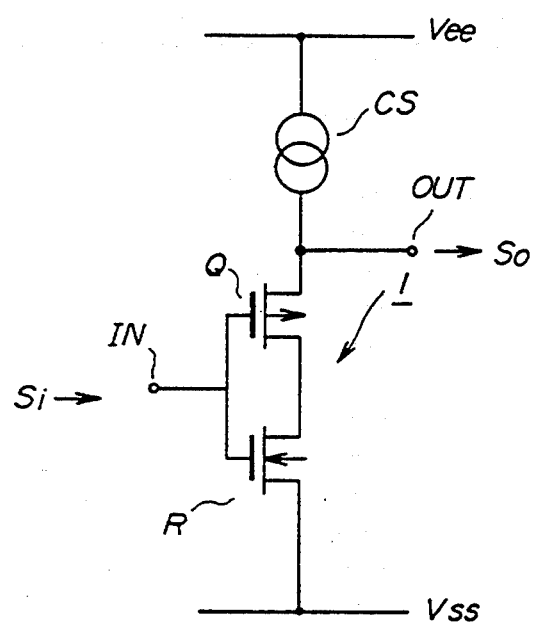
FIG. 1 is a circuit diagram of a first embodiment of the present invention.

FIG. 1 is a circuit diagram of a pulse generator according to a first embodiment of the present invention. The pulse generator shown in FIG. 1 is composed of field effect transistors Q and R having different conduction types, and a constant-current source (current control circuits) CS. An element having a resistance, such as a resistor or a transistor, can be substituted for the constant-current source CS. The transistor Q is a p-channel transistor and the transistor R is an n-channel transistor. A series current path 1 is formed by the transistors Q and R. An input terminal IN is connected to the gates of the transistors Q and R, which are connected in series between an output terminal OUT and a low-potential power supply line Vss. More specifically, the source of the transistor Q is connected to the output terminal OUT, and the drain thereof is connected to the drain of the transistor R. The source of the transistor R is connected to the low-potential power supply line Vss. The constant-current source CS is connected between a high-potential power supply line Vee and the output terminal OUT.

While the logic level of an input signal Si applied to the input terminal IN is changing from "L (low)" to "H (high)", both the transistors Q and R are instantaneously ON, and the potential of the output terminal OUT instantaneously decreases from a high level. Hence, an output signal So in the form of a short-time ripple is obtained at the output terminal OUT.

Figure 2A:
FIGS. 2(a)-(g) are a waveform diagram of signals showing operations of embodiments of the present invention.
Figure 2B:

FIG. 2(a) shows a waveform of the input signal Si, and FIG. 2(b) shows a waveform of the output signal So. Both the transistors Q and R are maintained in the OFF state during the time other than the time when the level of the input signal Si changes.

The pulse generator shown in FIG. 1 has a response characteristic better than that of a conventional pulse generator disclosed in the aforementioned document. The pulse generator disclosed in the document has two field effect transistors and an inverter. The input signal is directly applied to the gate of one of the transistors, and applied, via the inverter, to the gate of the other transistor. Since the inverter functions as a delay element, the input signal is not simultaneously applied to the gates of the transistors. Hence, the conventional pulse generator does not operate at a high speed. The pulse generator shown in FIG. 1 does not use such an inverter.

Figure 3:
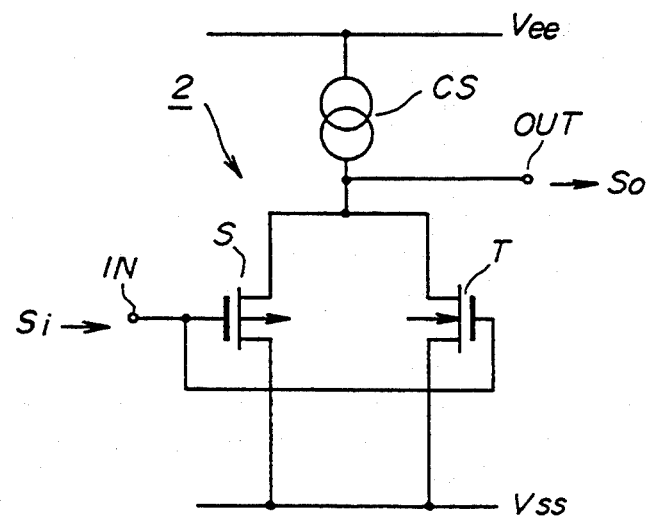
FIG. 3 is a circuit diagram of a second embodiment of the present invention.

FIG. 3 is a circuit diagram of a pulse generator according to a second embodiment of the present invention, in which those parts which are the same as those shown in FIG. 1 are given the same reference numerals. A p-channel field effect transistor S and an n-channel field effect transistor T are substituted for the transistors Q and R shown in FIG. 1. The transistors S and T, which form a parallel current path 2, are connected in parallel between the output terminal OUT and the low-potential power supply line Vss. More specifically, the source of the transistor S and the drain of the transistor T are connected to the output terminal OUT, and the drain of the transistor S and the source of the transistor T are connected to the low-potential power supply line Vss.

In a stationary mode in which the input signal Si does not change, either the transistor S or the transistor T is ON. When the level of the input signal Si changes from "L" to "H" or vice versa, both the transistors S and T are instantaneously OFF (switches to a high-impedance state), and the level of the output signal So instantaneously increases. In this manner, a short-time pulse is generated.

The output signal So shown in FIG. 3 has an amplitude larger than that of the output signal So shown in FIG. 1, because two transistors S and T are connected in parallel between the output terminal OUT and the low-potential power supply line Vss, as shown in FIG. 3. The transistors Q and R shown in FIG. 1 are connected in series between the output terminal OUT and the low-potential power supply line Vss.

Figure 2C:
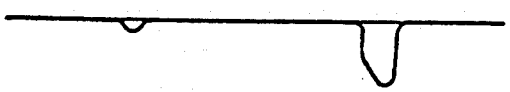
Figure 4:
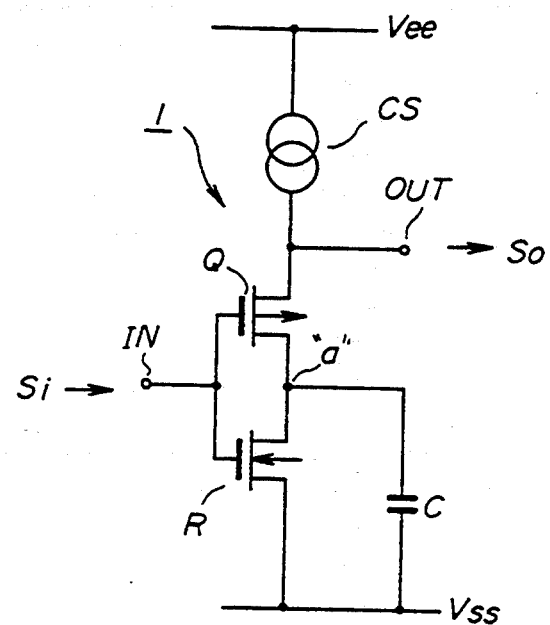
FIG. 4 is a circuit diagram of a third embodiment of the present invention.

FIG. 4 is a circuit diagram of a pulse generator according to a third embodiment of the present invention. In FIG. 4, parts which are the same as those shown in FIG. 1 are given the same reference numerals. A capacitor C is connected between the drain and source of the transistor R. In the stationary mode, either the transistor Q or the transistor R is OFF, and the output signal So is maintained at the high level. The capacitor C has been charged up in the stationary "L" input mode, and has been discharged in the stationary "H" input mode. When the level of the input signal Si changes from "L" to "H" as shown in FIG. 2(a), the level of the output signal So instantaneously decreases slightly, as shown in FIG. 2(c) because of charged capacitance. When the level of the input signal Si changes from "H" to "L", the capacitor C is charged up and hence the level of the output signal So instantaneously decreases greatly, as shown in FIG. 2(c). In other words, during input signal transition "L" to "H", (the series transistor (first and second transistors) ON-ON current)−(capacitor discharge current) is sinked, and slight decrease in So appears. Input transistor "H" to "L" causes the transistor ON-ON current) and capacitor charging, and great decrease appears in the output signal So. In the above manner, the pulse generator shown in FIG. 4 can detect only the fall edge of the input signal Si. In order to more definitely discriminate the large pulse from the slight pulse, it may be possible to compare the output signal So with a threshold level for discriminating these pulses from each other.

Figure 5:
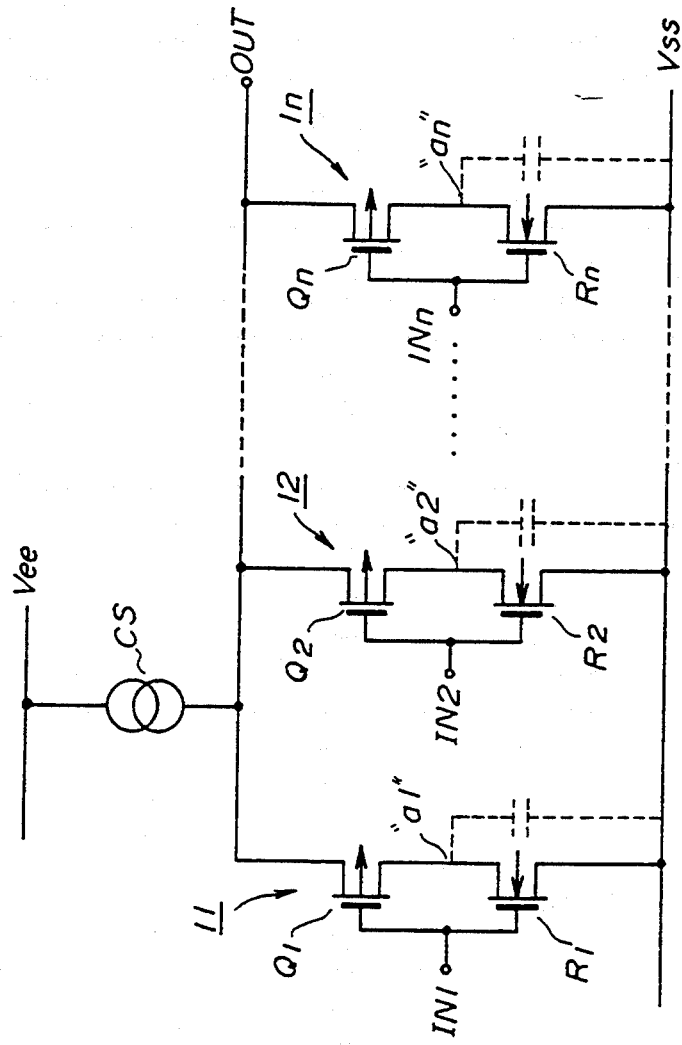
FIG. 5 is a circuit diagram of a fourth embodiment of the present invention.

FIG. 5 is a circuit diagram of a fourth embodiment of the present invention. In FIG. 5, parts which are the same as those shown in FIG. 1 are given the same reference numerals. The circuit shown in FIG. 5, which functions as a signal combiner/pulse generator, is composed of a plurality of pulse generators 11-1n, each having the circuit configuration shown in FIG. 1. The pulse generators 11-1n are connected in parallel between the constant-current source CS (output terminal OUT) and the low-potential power supply line Vss. Input signals IN1, IN2, . . . , INn are applied to the input gates of the pulse generators 11, 12, . . . , 1n, respectively. When level of one of the input signals IN1-INn changes, a one-shot short-time pulse is generated and output via the output terminal OUT. It will be noted that the circuit having the pulse generating function and the pulse combining function can be used as an ATD circuit for the SRAM. It is also possible to use capacitors illustrated by broken lines, as shown in FIG. 5. These capacitors are connected between nodes "a1", "a2", . . . , "an" and the low-potential power supply line Vss.

Figure 6:
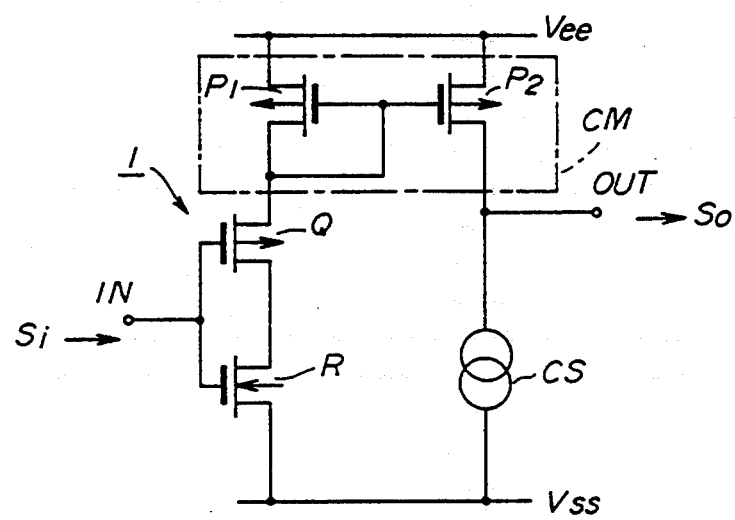
FIG. 6 is a circuit diagram of a fifth embodiment of the present invention.

FIG. 6 is a circuit diagram of a pulse generator according to a fifth embodiment of the present invention. In FIG. 6, parts which are the same as those shown in FIG. 1 are given the same reference numerals. A current-mirror circuit CM is substituted for the constant-current source CS shown in FIG. 1. The current-mirror circuit CM is composed of a pair of p-channel field effect transistors P1 and P2. The transistor P1 is connected between the high-potential power supply line Vee and the source of the transistor Q, and the transistor P2 is connected between the high-potential power supplied line Vee and a constant-current source CS. The gates of the transistors P1 and P2 are connected to each other and the source of the transistor Q. The ratio of the channel widths of the transistors P1 and P2 are 1:n (n>1), and the channel lengths thereof are identical to each other. For n=10, a current amplification factor of the current-mirror circuit CM is approximately equal to 10. By using the current-mirror circuit CM, it becomes possible to obtain the output pulse So having an amplified voltage level, which is higher than the voltage level of the output pulse So generated by the pulse generator shown in FIG. 1.

Figure 2D:

In the stationary mode of the pulse generator shown in FIG. 6, both the transistors P1 and P2 are OFF. When the input signal Si changes, both the transistors Q and R instantaneously turn ON, and thus both the transistors P1 and P2 are turned ON. Hence, the amplified output pulse So shown in FIG. 2(d) is obtained at the output terminal OUT.

Figure 7:
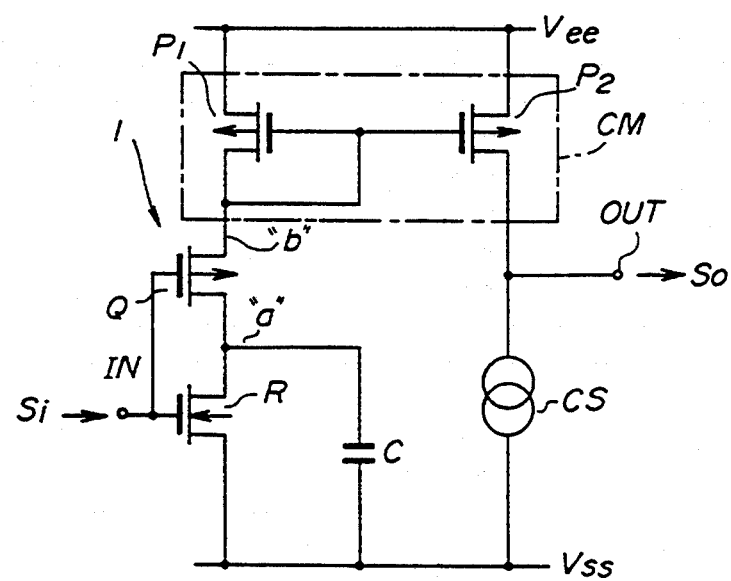
FIG. 7 is a circuit diagram of a sixth embodiment of the present invention.

FIG. 7 is a circuit diagram of a pulse generator according to a sixth embodiment of the present invention. In FIG. 7, parts which are the same as those shown in FIG. 6 are given the same reference numerals. The pulse generator shown in FIG. 7 is obtained by adding the current-mirror circuit CM shown in FIG. 7 to the pulse generator shown in FIG. 4. The capacitor C is connected between the node "a" and the low-potential power supply line Vss.

Figure 2E:
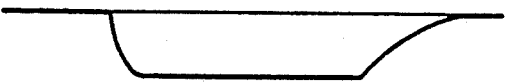
Figure 2F:
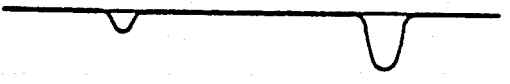
Figure 2G:

The operation of the pulse generator shown in FIG. 7 will now be described with reference to FIG. 2(a), and (e)–(g). FIGS. 2(e) and (f) are voltage waveform diagrams of signals obtained at nodes "a" and "b" and FIG. 2(g) is a voltage waveform diagram of the output signal So obtained at the output terminal OUT. When the input signal Si rises, the transistor R turns ON. Hence, the charge stored in the capacitor C flows out to the low-potential power supply line Vss, and the potential of the node "a" rapidly decreases in accordance with a time constant of the circuit composed of the capacitor C and the transistor R. During this time, a voltage ripple obtained at the node "b" is very small. When the input signal Si falls, the transistor Q turns ON, and the transistor R turns OFF. A charge current passes through the capacitor C, and the potential of the node "a" gradually increases in accordance with a voltage developed across the terminals of the capacitor C, as shown in FIG. 2(e). The charge current C passing through the capacitor C is multiplied about 10 times by the current-mirror circuit CM. Hence, the output signal So has a pulse waveform as shown in FIG. 2(g). The pulse waveform of the output signal So has an amplitude (voltage level) greater than that of the pulse waveform obtained at the node "b" shown in FIG. 2(f). It will be enough for the voltage level of the output signal So shown in FIG. 2(g) to drive a logic circuit (not shown) coupled to the pulse generator.

Figure 8:
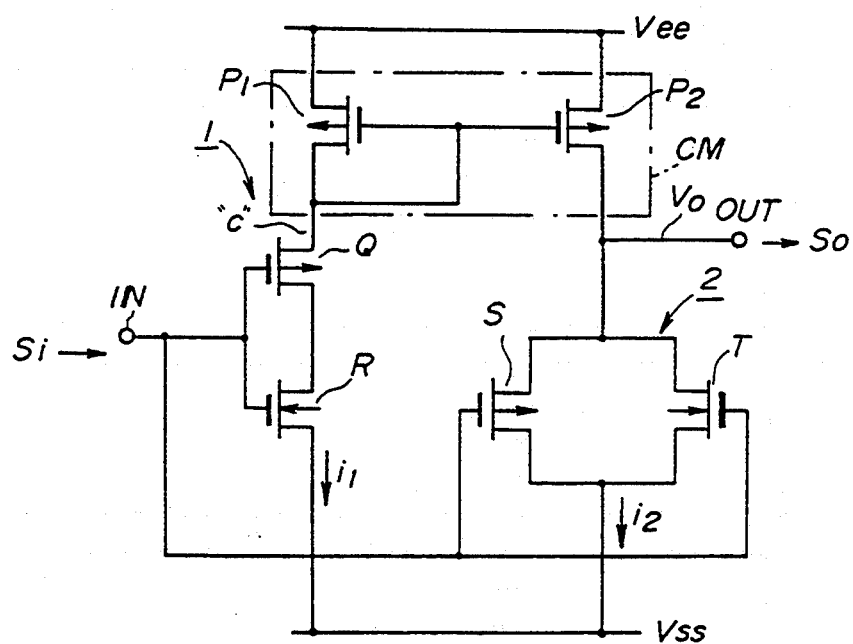
FIG. 8 is a circuit diagram of a seventh embodiment of the present invention.

FIG. 8 is a circuit diagram of a pulse generator according to a seventh embodiment of the present invention. In FIG. 8, parts which are the same as those shown in the previous figures are given the same reference numerals. The pulse generator shown in FIG. 8 is an improvement of the pulse generator shown in FIG. 6. The constant-current source CS is composed of the transistors S and T shown in FIG. 3. In the stationary mode, either the transistor S or the transistor T is ON, and the output signal So is maintained at the low level. When the level of the input signal Si changes from "L" to "H" or vice versa, both the transistors S and T instantaneously turn OFF (switch to the high-impedance state). Hence, the amplified current from the transistor P2 of the current-mirror circuit CM is prevented from passing through the transistors S and T. Hence, the level of the output signal So instantaneously increases greatly.

Figure 9A:
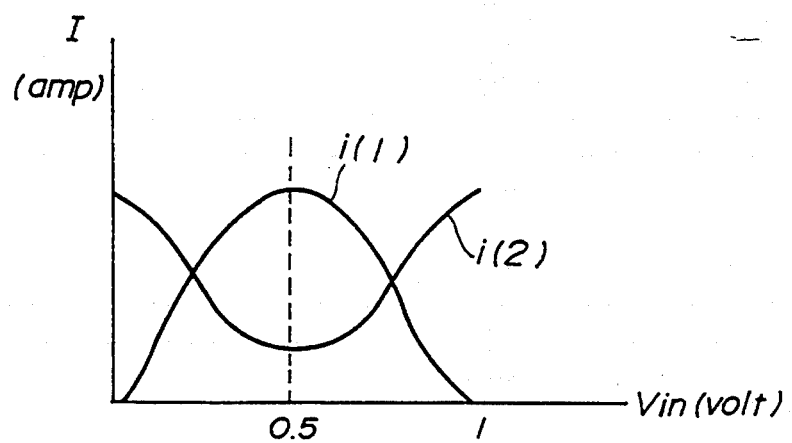
FIGS 9A-9B are a waveform diagram showing the operation of the seventh embodiment of the present invention.
Figure 9B:
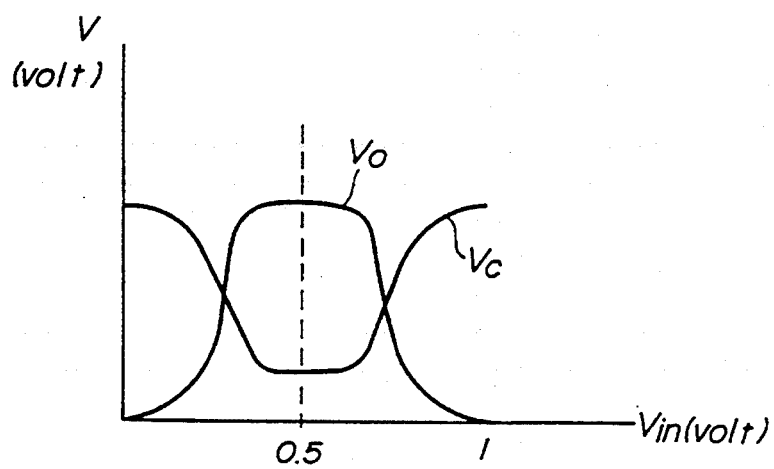

FIG. 9A is a graph showing the relationship between the voltage Vin of the input signal Si and currents i1 and i2 passing through the current paths 1 and 2, respectively. FIG. 9B is a graph showing the relationship between the input voltage Vin and a voltage Vc of the node "c" and the relationship between the input voltage Vin and the voltage Vo of the output signal So. For the sake of simplicity, Vin=1 when Vin is a maximum voltage.

In the pulse generator shown in FIG. 6, there is no change in the impedance of the constant-current source (resistance element) CS. Thus, the current i2 which is about 10 times the current i1 is simply obtained. In the circuit configuration shown in FIG. 8, when a largest amount of the current i1 is obtained, the current i2 is the smallest, that is, the impedance of the parallel current path 2 is the largest. Hence, the output voltage So fully swings.

Further, the pulse generator shown in FIG. 8 has the following advantages. In the stationary mode, the currents i1 and i2 do not flow from the high-potential power supply line Vee to the low-potential power supply line Vss. These currents flow only in the transient mode. Hence, the pulse generator shown in FIG. 8 does not consume a large amount of power. Since the parallel current path 2 is a push-pull circuit, the response characteristic of the pulse generator shown in FIG. 8 is better than that of the pulse generator shown in FIG. 6.

Figure 10:
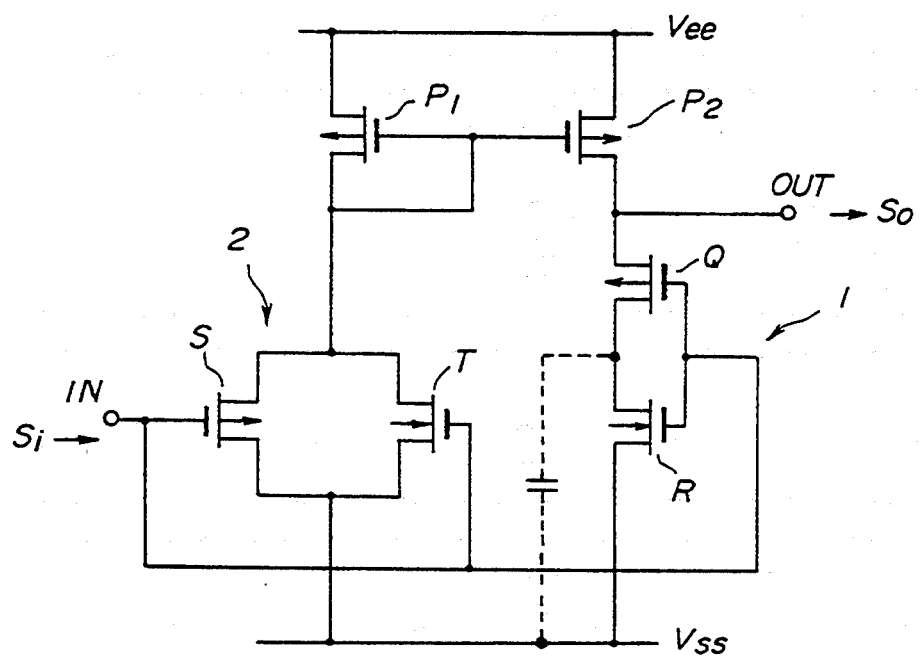
FIG. 10 is a circuit diagram of an eighth embodiment of the present invention.

FIG. 10 is a circuit diagram of a pulse generator according to an eighth embodiment of the present invention. The constant-current source CS shown in FIG. 6 is replaced by the series current path 1 composed of the transistors Q and R connected in series. The output signal So of the pulse generator shown in FIG. 10 fully swings at a high speed as in the case of the pulse generator shown in FIG. 8. However, the pulse generator shown in FIG. 10 consumes a large amount of power, as compared with the circuit shown in FIG. 8, since currents i1 and i2 pass in the stationary mode.

Figure 11:
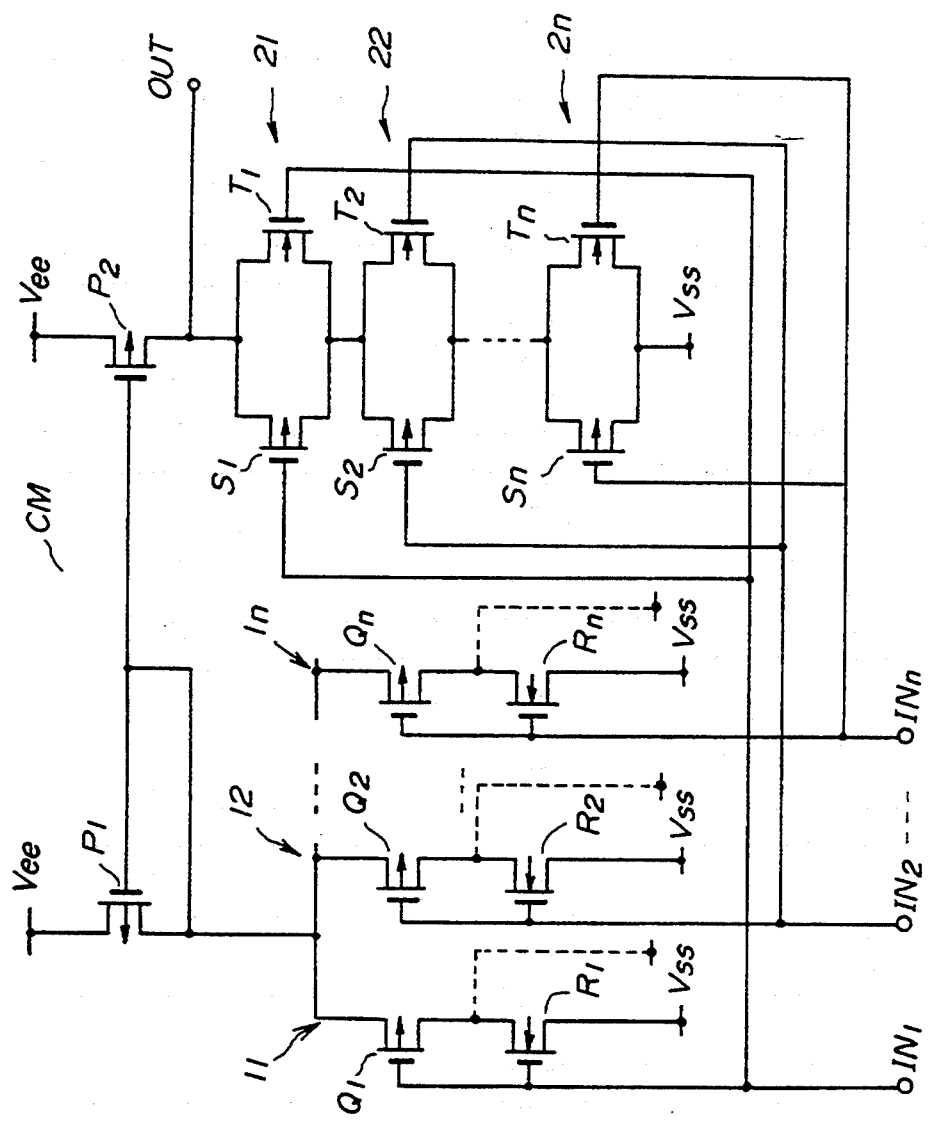
FIG. 11 is a circuit diagram of a ninth embodiment of the present invention.

FIG. 11 is a circuit diagram of a ninth embodiment of the present invention. The circuit shown in FIG. 11 functions as a signal combiner/pulse generator, which includes a plurality of pulse generators, and a plurality of input terminals IN1, IN2, ..., INn. The series current paths 11, 12, ..., 1n are connected in parallel between the drain of the transistor P1 of the current-mirror circuit CM and the low-potential power supply line Vss. The parallel current paths 21, 22, ..., 2n are connected in series between the drain of the transistor P2 of the current-mirror circuit P2 and the low-potential power supply line Vss. When the potential of any one of the input terminals changes, a short-term pulse is output to the output terminal OUT. The signal combiner/pulse generator shown in FIG. 11 can be used as the ATD circuit, a chip select signal generator and/or a write enable signal generator, all of which are used in the SRAM. It is also possible to form a row address strobe signal generator with the signal combiner/pulse generator shown in FIG. 11. It is possible to interchange the paths 11, 12, ..., 1n with the paths 21, 22, ..., 2n.

Figure 12:
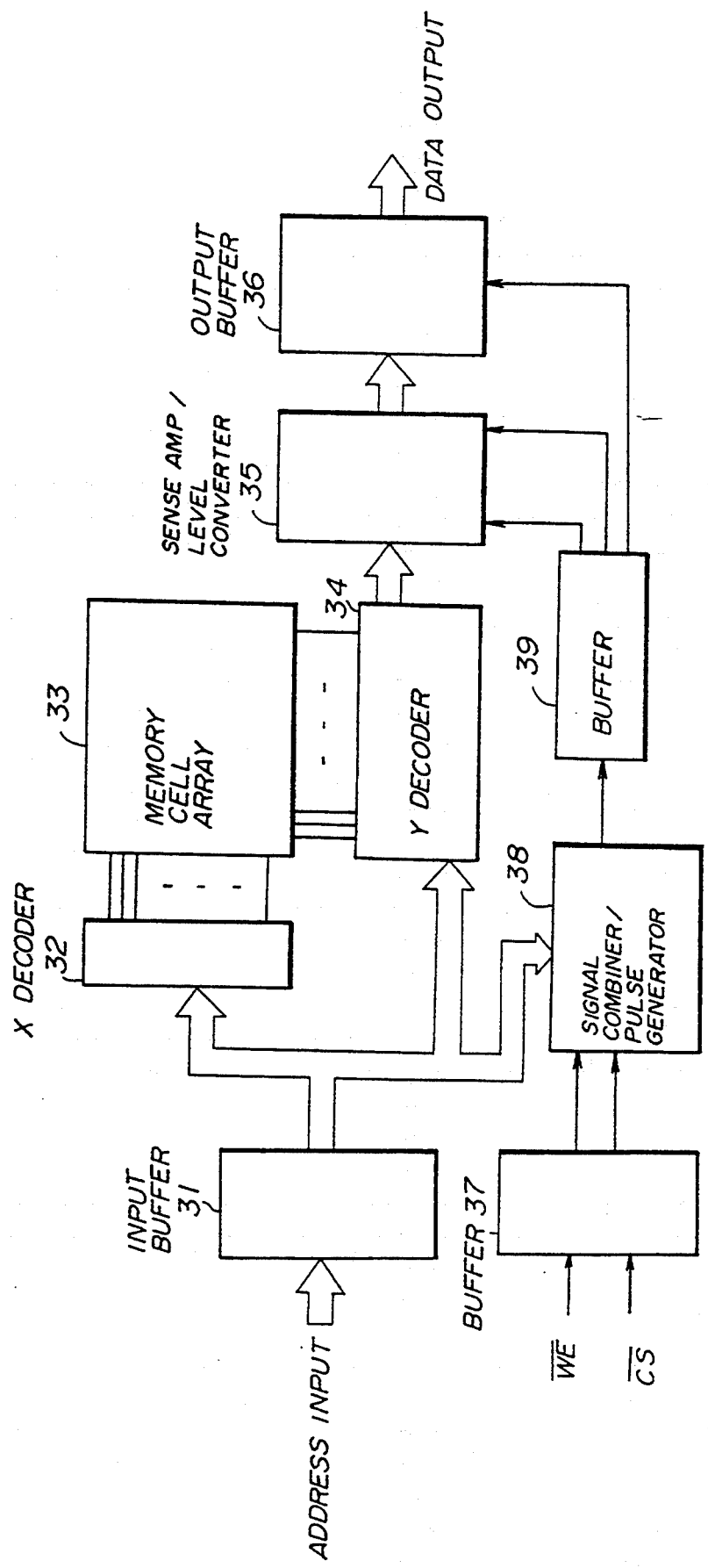
FIG. 12 is a block diagram of an SRAM which includes a signal combiner/pulse generator according to the present invention.

FIG. 12 is a block diagram of an SRAM which includes the signal combiner/pulse generator according to the present invention. The SRAM shown in FIG. 12 is composed of an input buffer 31, an X decoder 32, a memory cell array 33, a Y decoder 34, a sense amplifier/level converter 35, an output buffer 36, a buffer 37, a signal combiner/pulse generator 38, and a buffer 39. An address signal consisting of a plurality of address bits is applied to the X decoder 32, the Y decoder part of the block 34 and the signal combiner/pulse generator 38. This signal combiner/pulse generator 38 has a circuit configuration as shown in FIG. 11, and the address bits of the address signal are applied to some of the input terminals IN1, IN2, ..., INn. The X decoder 32 drives word lines which run in the memory cell array 33, and the Y decoder selects bit lines which run in the memory cell array 33. Data stored in memory cells arranged in rows and columns are sensed by the sense amplifier 35. The sensed data are level-converted and output to the output buffer 36.

A low-active write enable signal WE and a low-active chip select signal $\overline{CS}$ are applied to the signal combiner/pulse generator 38 via the buffer 37. Since it is enough to detect the falls of signals $\overline{WE}$ and $\overline{CS}$, the capacitor C shown in FIG. 3 is added to each of the series current paths related to the signals $\overline{WE}$ and $\overline{CS}$ in the same manner as shown in FIG. 5. If the signal $\overline{WE}$ is applied to the input terminal INn shown in FIG. 11, the capacitor C is connected in parallel between the drain and source of the transistor Rn. When one of the address bits, the write enable signal $\overline{WE}$ and the chip select signal $\overline{CS}$ changes, the signal combiner/pulse generator 38 generates a one-shot short-time pulse, which is applied to the blocks 35 and 36 via the buffer 39.

In response to the short-time pulse, the sense amplifier/pulse generator 38 is controlled so that the bit lines are precharged and the sense amplifier are reset. Further, the output buffer 36 is reset in response to the short-time pulse. It is also possible to use the short-time pulse in order to other parts of the SRAM. For example, an automatic power-down control procedure based on the short-time pulse can be performed.

It should be noted that the circuit shown in FIG. 11 has both the edge detection function and the pulse generating function and hence does not need long signal lines used to connect the edge detection circuits (which generates short-time pulses) and the pulse generating circuit (formed with a logic circuit) as disclosed in the aforementioned document. The circuit shown in FIG. 11 includes a plurality of pulse generators which are coupled to each other by a wired-OR logic and is an integrated circuit having both the edge detection function and the pulse generating function. Hence, the present invention can overcome the aforementioned disadvantages due to the arrangement in which the short-time pulses generated by the edge detection circuits (pulse generators) are transferred via the signal lines having CR distributed constants which are not negligible with respect to the short-time pulses.

Figure 13:
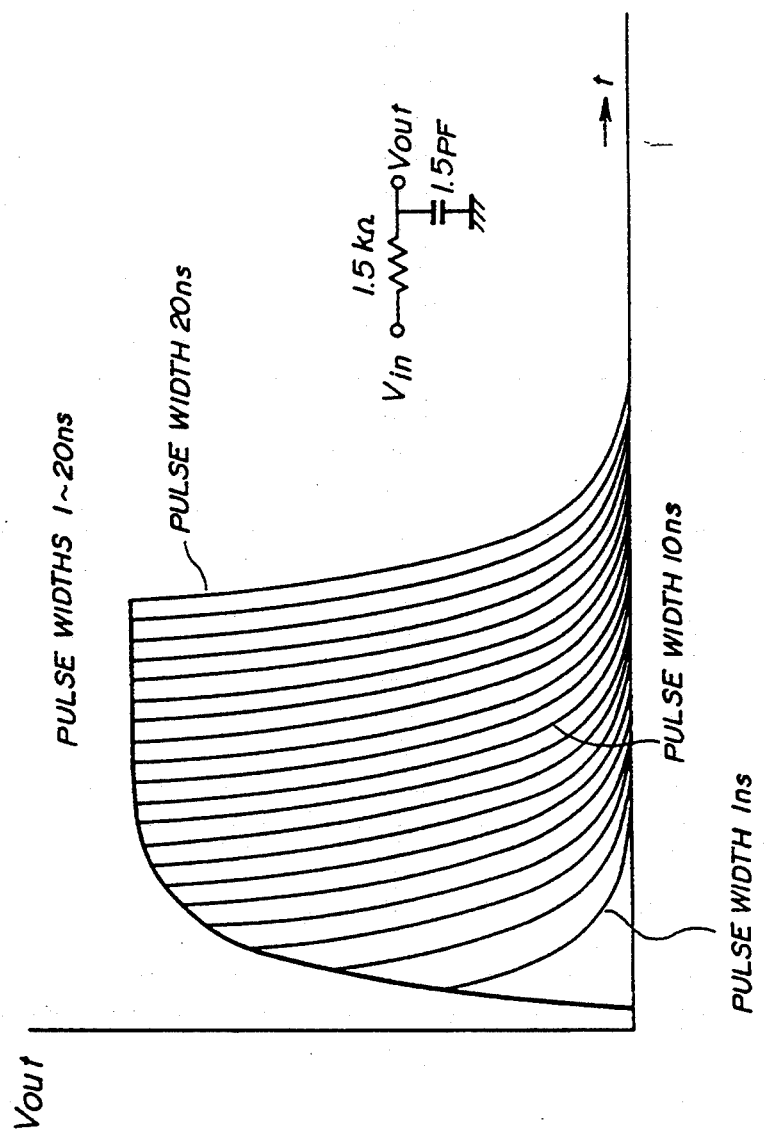

FIGS. 13 and 14 are theoretically calculated graphs showing distortions of a short-time pulse which take place while the short-time pulse is transferred via a signal line. The graphs of FIGS. 13 and 14 are the results of a simulation in which pulses having different pulse widths are applied to the input side of a signal line which has a concentrated resistance of 1.5 kΩ and a concentrated capacitance of 1.5 pF. The horizontal axis of each of the graphs denotes passage of time from the time when the pulse signal is applied, and the vertical axis thereof denotes a voltage obtained on the output side of the signal line. The pulse widths are between 1 ns and 20 ns. FIG. 13 shows all the pulse widths, and FIGS. 14(a)–(e) show pulse widths of 1–4 ns and 10 ns, respectively. FIGS. 13 and 14 show that the pulse signal is greatly distorted when it has a pulse width equal to or shorter than 10 ns. In this case, it is substantially impossible to correctly transfer the short-time pulse.

According to the present invention, it becomes possible to transfer a pulse having a pulse width having an order of 1 ns or less. The present invention contributes the speeding up of not only SRAMs but also DRAMs.

The present invention is not limited to the specifically disclosed embodiments, and variations and modifications may be made without departing from the scope of the present invention.

What is claimed is:

1. A pulse generator comprising:
a first current control circuit;
a first transistor having a source coupled to a first power supply line via said first current control circuit, a drain and a gate;
a second transistor having a gate connected to the gate of said first transistor, a drain connected to the drain of said first transistor, and a source connected to a second power supply line, said second transistor having a conduction type different from that of said first transistor;
an input terminal connected to the gates of the first and second transistors, an input signal being applied to the input terminal; and
an output terminal directly connected to the first current control circuit, an output pulse indicative of a transient change in the input signal being output via the output terminal,
said first current control circuit including a current-mirror circuit,
said current-mirror circuit including
a third transistor having a source connected to the first power supply line, a drain connected to the source of said first transistor and a gate connected to the source of said first transistor; and
a fourth transistor having a source connected to the first power supply line, a drain connected to the output terminal, and a gate connected to the gate of said third transistor, and
a second current control circuit connected between the drain of said fourth transistor and the second power supply line, said second current control circuit including:
a fifth transistor having a source connected to the drain of said fourth transistor, a drain connected to the second power supply line, and a gate connected to the input terminal; and
a sixth transistor having a drain connected to the drain of said fourth transistor, a source connected to the second power supply line, and a gate connected to said first input terminal.

2. A pulse generator comprising:
a first current control circuit formed by a current mirror circuit;
a first transistor having a source coupled to a first power supply line via said first current control circuit, a drain connected to a second power supply line, and a gate;
a second transistor having a gate connected to the gate of said first transistor, a drain connected to the source of said first transistor, and a source connected to the second power supply line, said second transistor having a conduction type different from that of said first transistor;
an input terminal connected to the gates of the first and second transistors, an input signal being applied to the input terminal; and
an output terminal connected to the first current control circuit, an output pulse indicative of a change in the input signal being generated via the output terminal, said current-mirror circuit including
a third transistor having a source connected to the first power supply line, a drain connected to the source of said first transistor and the drain of said second transistor, and a gate connected to the source of said first transistor; and
a fourth transistor having a source connected to the first power supply line, a drain connected to the output terminal, and a gate connected to the gate of said third transistor, and
a second current control circuit connected between the drain of said fourth transistor and the second power supply line, said second current control circuit including:
a fifth transistor having a source connected to the drain of said fourth transistor, a drain, and a gate connected to the input terminal; and
a sixth transistor having a drain connected to the drain of said fifth transistor, a source connected to the second power supply line, and a gate connected to said input terminal.

3. A pulse generator comprising:
a first current control circuit connected to a first power supply line;
n pairs of first and second transistors having different conduction types where n is an integer, each of said n pairs being connected between the first current control circuit and a second power supply line, gates of the first and second transistors of each of the n pairs being connected to each other;
n input terminals respectively connected to the gates of the n pairs of first and second transistors, n input signals being respectively applied to the n input terminals; and
an output terminal directly connected to the first current control circuit, an output pulse indicative of a transient change in one of the n input signals being output via the output terminal.

4. A pulse generator as claimed in claim 3, wherein each of said n pairs of first and second transistors comprises a capacitor connected between the drain and source of the second transistor.

5. A pulse generator as claimed in claim 3, wherein said first current control circuit comprises a current-mirror circuit.

6. A pulse generator as claimed in claim 5, wherein said current-mirror circuit comprises:
a third transistor having a source connected to the first power supply line, a drain connected to the source of said first transistor of each of the n pairs, and a gate connected to the drain of said third transistor; and
a fourth transistor having a source connected to the first power supply line, a drain connected to the output terminal, and a gate connected to the gate of said third transistor, and
wherein said pulse generator comprises a second current control circuit connected between the drain of said fourth transistor and the second power supply line.

7. A pulse generator as claimed in claim 6, wherein said pulse generator comprises a capacitor connected between the drain and source of said second transistor.

8. A pulse generator as claimed in claim 6, wherein:
said second current control circuit comprises n pairs of fifth and six transistors having different conduction types;
each of said n pairs of fifth and sixth transistors is connected to each other in parallel;
gates of the fifth and sixth transistors of each of the n pairs are connected to each other;
said n pairs of fifth and sixth transistors are connected in series between the drain of said fourth transistor and said second power supply line; and
the gates of the n pairs of fifth and sixth transistors are respectively connected to the gates of the n pairs of first and second transistors.

9. A pulse generator comprising:
a first current control circuit connected to a first power supply line;
n pairs of first and second transistors having different conduction types where n is an integer, said n pairs being connected in series between the first current control circuit and a second power supply line, gates of the first and second transistors of each of the n pairs being connected to each other;
n input terminals respectively connected to the gates of the n pairs of first and second transistors, n input signals being respectively applied to the n input terminals; and
an output terminal connected to the first current control circuit, an output pulse indicative of a change in one of the n input signals being output via the output terminal.

10. A pulse generator as claimed in claim 9, wherein said first current control circuit comprises a current-mirror circuit.

11. A pulse generator as claimed in claim 10, wherein said current-mirror circuit comprises:
a third transistor having a source connected to the first power supply line, a drain connected to a source of a first transistor of at least one of the n pairs, and a gate connected to the drain of said third transistor; and
a fourth transistor having a source connected to the first power supply line, a drain connected to the output terminal, and a gate connected to the gate of said third transistor, and
wherein said pulse generator comprises a second current control circuit connected between the drain of said fourth transistor and the second power supply line.

12. A pulse generator as claimed in claim 11, wherein:
said second current control circuit comprises n pairs of fifth and sixth transistors having different conduction types;
each of said n pairs of fifth and sixth transistors is connected in series between the drain of said fourth transistor and said second power supply line;
gates of the fifth and sixth transistors of each of the n pairs are connected to each other; and
the gates of the n pairs of fifth and sixth transistors are respectively connected to the gates of the n pairs of first and second transistors.

13. A pulse generator comprising:
a first current control circuit;
a first transistor having a source coupled to a first power supply line via said first current control circuit, a drain and a gate;
a second transistor having a gate connected to the gate of said first transistor, a drain connected to the drain of said first transistor, and a source connected to a second power supply line, said second transistor having a conduction type different from that of said first transistor;
an input terminal connected to the gates of the first and second transistors, an input signal being applied to the input terminal; and
an output terminal connected to the first current control circuit, an output pulse indicative of a change in the input signal being output via the output terminal,
said first current control circuit comprising a current-mirror circuit including
a third transistor having a source connected to the first power supply line, a drain connected to the source of said first transistor and a gate connected to the source of said first transistor, and
a fourth transistor having a source connected to the first power supply line, a drain connected to the output terminal, and a gate connected to the gate of said third transistor, and
a second current control circuit connected between the drain of said fourth transistor and the second power supply line, said second current control circuit including:
a fifth transistor having a source connected to the drain of said fourth transistor, a drain connected to the second power supply line, and a gate connected to the input terminal; and
a sixth transistor having a drain connected to the drain of said fourth transistor, a source connected to the second power supply line, and a gate connected to said first input terminal.

* * * * *